(12) United States Patent
Sato et al.

(10) Patent No.: US 8,289,089 B2
(45) Date of Patent: Oct. 16, 2012

(54) SURFACE MOUNT CRYSTAL OSCILLATOR AND MANUFACTURING METHOD OF THE SAME

(75) Inventors: Masashi Sato, Sayama (JP); Yasuo Sakaba, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 35 days.

(21) Appl. No.: 12/926,226

(22) Filed: Nov. 3, 2010

(65) Prior Publication Data

US 2011/0109394 A1    May 12, 2011

(30) Foreign Application Priority Data

Nov. 11, 2009 (JP) ................... P.2009-257910
Sep. 21, 2010 (JP) ................... P.2010-211201

(51) Int. Cl.
*H03B 1/00* (2006.01)
(52) U.S. Cl. .......................... 331/68; 331/158
(58) Field of Classification Search ............ 331/68, 331/158; 310/348
See application file for complete search history.

(56) References Cited

U.S. PATENT DOCUMENTS

| 7,095,161 | B2 * | 8/2006 | Unno et al. ............ 310/348 |
| 7,482,735 | B2 * | 1/2009 | Harada et al. .......... 310/348 |
| 2002/0033652 | A1 * | 3/2002 | Serizawa ............... 310/348 |

FOREIGN PATENT DOCUMENTS

| JP | 06-085599 | 3/1994 |
| JP | 08-162891 | 6/1996 |
| JP | 2002-100694 | 4/2002 |
| JP | 2003-133887 | 5/2003 |
| JP | 2003-179456 | 6/2003 |
| JP | 2007-158419 | 6/2007 |
| JP | 2008-035410 | 2/2008 |
| WO | 2005/109638 | 11/2005 |
| WO | 2009/072351 | 6/2009 |

\* cited by examiner

*Primary Examiner* — Joseph Chang
(74) *Attorney, Agent, or Firm* — Jacobson Holman PLLC (57) ABSTRACT

There are disclosed a surface mount crystal oscillator which can enhance a product quality and improve productivity while realizing miniaturization and a manufacturing method of the crystal oscillator. On wall faces of through holes formed in corner portions of a rectangular ceramic base, through terminals are formed; on the front surface of the ceramic base, leading terminals of crystal holding terminals which hold a crystal piece are connected to the diagonal through terminals; and on the back surface of the ceramic base, mount terminals connected to the through terminals are formed in the surface mount crystal oscillator.

6 Claims, 5 Drawing Sheets

SURFACE MOUNT CRYSTAL OSCILLATOR AND MANUFACTURING METHOD OF THE SAME

This application has a priority of Japanese no. 2009-257910 filed Nov. 11, 2009, and no. 2010-211201 filed Sep. 21, 2010, hereby incorporated by reference.

BACKGROUND OF THE INVENTION

1. Field of the Invention

The present invention relates to a crystal oscillator for surface mount, and more particularly, it relates to a surface mount crystal oscillator which can improve productivity and realize miniaturization and a manufacturing method of the same.

2. Description of the Related Art

[Prior Art]

A surface mount crystal oscillator is small-sized and light-weight, and is hence incorporated as a frequency or time reference source in a portable type electronic device.

In a conventional surface mount crystal oscillator, a crystal piece 2 is mounted on a ceramic substrate, and is covered and sealed with an inverted cover having a recessed shape. In recent years, there has been suggested an inexpensive household oscillator having a frequency deviation Δf/f which is comparatively loosely regulated, for example, from ±150 to ±250 ppm.

[Related Art]

It is to be noted that examples of a related prior art include Japanese Patent Application Laid-Open No. 2007-158419 'Surface Mount Crystal Oscillator' (Nihon Dempa Kogyo Co., Ltd.) and Japanese Patent Application Laid-Open No. 2003-179456 'Surface Mount Container for Crystal Product and Crystal Product using the Same' (Nihon Dempa Kogyo Co., Ltd.)

Japanese Patent Application Laid-Open No. 2007-158419 (Patent Document 1) discloses a constitution of a surface mount crystal oscillator in which a crystal piece 3 is mounted on an IC chip 2, the IC chip 2 and the like are formed on a mount substrate 4, and a metal cover 5 is disposed.

Moreover, Japanese Patent Application Laid-Open No. 2003-179456 (Patent Document 2) discloses a constitution of a surface mount container for a crystal product in which a crystal piece 3 is disposed on a single layer substrate 1A via a crystal terminal 6, and is sealed with a cover 2.

[Patent Document 1] Japanese Patent Application Laid-Open No. 2007-158419

[Patent Document 2] Japanese Patent Application Laid-Open No. 2003-179456

SUMMARY OF THE INVENTION

However, in the above conventional surface mount crystal oscillator, in recent years, an increasingly miniaturized constitution obtained by mounting a crystal piece on a substrate and further sealing the piece with a cover has a problem that it is difficult to decrease a defect ratio, improve productivity and enhance a product quality.

Specifically, when the crystal piece and the cover are miniaturized, the constitution needs to be contrived so that crystal holding terminals connected to the crystal piece by a conductive adhesive to hold the crystal oscillator and leading terminals led from the crystal holding terminals to electrodes do not electrically cause short circuit, and the conventional constitution cannot sufficiently realize miniaturization.

The present invention has been developed in view of the above situation, and an object thereof is to provide a surface mount crystal oscillator which can enhance a product quality and improve productivity while realizing miniaturization and a manufacturing method of the same.

To solve the problems of the above conventional examples, the present invention provides a surface mount crystal oscillator comprising a crystal piece held by first and second crystal holding terminals on a rectangular ceramic substrate, wherein on wall faces of through holes formed in corner portions of the substrate, through terminals are formed, on the front surface of the substrate, a first leading terminal led from the first crystal holding terminal is connected to the through terminal of the shortest corner portion, and a second leading terminal led from the second crystal holding terminal is connected to the through terminal of the corner portion in a direction reverse to a direction in which the first leading terminal is led, and on the back surface of the substrate, mount terminals connected to the through terminals are formed, which produces an effect that while realizing miniaturization, short circuit can be prevented to enhance a product quality, thereby improving productivity.

Moreover, according to the present invention, in the above surface mount crystal oscillator, one leading electrode and the other leading electrode of the crystal piece are led in opposite directions, and the first crystal holding terminal and the second crystal holding terminal constitute such a both-ends holding type as to hold both ends of the crystal piece.

Furthermore, according to the present invention, in the above surface mount crystal oscillator, the first crystal holding terminal is connected to the one leading electrode of the crystal piece by a conductive adhesive in an end portion from which the first leading terminal is led, and the second crystal holding terminal is connected to the other leading electrode of the crystal piece by the conductive adhesive in an end portion from which the second leading terminal is led.

In addition, according to the present invention, in the above surface mount crystal oscillator, the end portion of the first crystal holding terminal on a side on which any conductive adhesive is not disposed is formed to be short inwardly from the end portion of the one leading electrode, and the end portion of the second crystal holding terminal on a side on which any conductive adhesive is not disposed is formed to be short inwardly from the end portion of the other leading electrode.

Moreover, according to the present invention, in the above surface mount crystal oscillator, the one leading electrode and the other leading electrode of the crystal piece are led in the same direction, and the first crystal holding terminal and the second crystal holding terminal constitute such a cantilever type as to hold one end of the crystal piece.

Furthermore, according to the present invention, in the above surface mount crystal oscillator, the first crystal holding terminal is connected to the one leading electrode led to one side of the crystal piece by a conductive adhesive in an end portion from which the first leading terminal is led, the second crystal holding terminal is connected to the other leading electrode led to the one side of the crystal piece by the conductive adhesive in the one side of the crystal piece from which the other leading electrode is led, and the second leading terminal passes under the crystal piece from a position of the second crystal holding terminal connected by the conductive adhesive and is connected to the through terminal of the corner portion in the direction reverse to the direction in which the first leading terminal is led.

The present invention provides a manufacturing method of a surface mount crystal oscillator comprising a crystal piece held by first and second crystal holding terminals on a rectangular ceramic substrate, comprising: a step of forming, in a sheet-like ceramic material, break lines which specify individual ceramic substrate regions and through holes which correspond to corner portions of the regions and firing the ceramic material to form a sheet-like ceramic base; a step of forming metal layers of through terminals on wall faces of the through holes, forming, on the front surface of the ceramic base, a pattern of a metal layer in which the first crystal holding terminal and a first leading terminal led from the terminal are connected to the through terminal of the shortest corner portion, and a second leading terminal led from the second crystal holding terminal is connected to the through terminal of the corner portion in a direction reverse to a direction in which the first leading terminal is led, and forming, on the back surface of the ceramic base, a pattern of a metal layer of mount terminals connected to the through terminals; a step of mounting the crystal piece on the first and second crystal holding terminals; and a step of regulating a vibration frequency by use of the mount terminal connected to the first crystal holding terminal and the mount terminal connected to the second crystal holding terminal.

Moreover, according to the present invention, in the above manufacturing method of the surface mount crystal oscillator, an excitation electrode on the front surface of the crystal piece is irradiated with gas ions to cut the front surface from the excitation electrode, and a mass of the excitation electrode is decreased to regulate the vibration frequency from a low frequency to a high frequency.

Furthermore, according to the present invention, in the above manufacturing method of the surface mount crystal oscillator, a metal film is applied onto the excitation electrode to regulate the vibration frequency from a high frequency to a low frequency.

DESCRIPTION OF REFERENCE NUMERALS

1 . . . ceramic base (substrate), 1A . . . sheet-like ceramic base, 2 . . . crystal piece, 3 . . . metal cover (cover), 4 . . . crystal holding terminal, 4a and 4b leading terminal, 5a and 5b . . . mount terminal, 5x . . . through terminal, 6a . . . excitation electrode, 6b leading electrode, 7 . . . conductive adhesive, 8 . . . seal material, and 9 . . . through hole.

DESCRIPTION OF THE PREFERRED EMBODIMENT

An embodiment of the present invention will be described with reference to the drawings.

Summary of Embodiment

In a surface mount crystal oscillator according to an embodiment of the present invention, on wall faces of through holes formed in corner portions of a rectangular ceramic substrate, through terminals are formed. On the front surface of the substrate, leading terminals of crystal holding terminals which hold a crystal piece are connected to the diagonal through terminals. Moreover, on the back surface of the substrate, mount terminals connected to the through terminals are formed. While realizing miniaturization, short circuit is prevented to enhance a product quality, thereby improving productivity.

Figure 1:
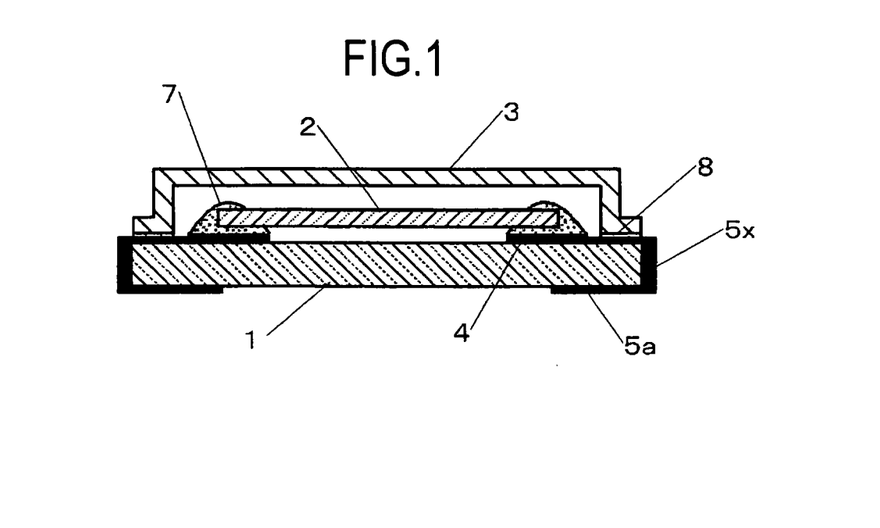
FIG. 1 is an explanatory sectional view of a surface mount crystal oscillator according to an embodiment of the present invention.

[Constitution of Surface Mount Crystal Oscillator: FIG. 1]

The surface mount crystal oscillator according to the embodiment of the present invention will be described with reference to FIG. 1. FIG. 1 is an explanatory sectional view of the surface mount crystal oscillator according to the embodiment of the present invention.

In the surface mount crystal oscillator according to the embodiment of the present invention (the present oscillator), as shown in FIG. 1, a crystal piece 2 is mounted on crystal holding terminals 4 formed on a ceramic base (a substrate) 1 via a conductive adhesive 7. Furthermore, a recessed metal cover (a cover) 3 is inverted and joined onto the ceramic base 1 which is sealed.

Moreover, a through terminal (a side wall terminal) 5x is formed on the side surface of the substrate 1, connected to a leading terminal 4a led from the crystal holding terminal 4 formed on the front surface of the substrate 1, and connected to a mount terminal 5a formed on the back surface of the substrate 1.

The through terminals 5x are formed on side walls of through holes 9 formed in four corners of the substrate 1.

Furthermore, a seal material 8 with insulation properties is formed in a contact portion between the substrate 1 and the cover 3.

Figure 2:
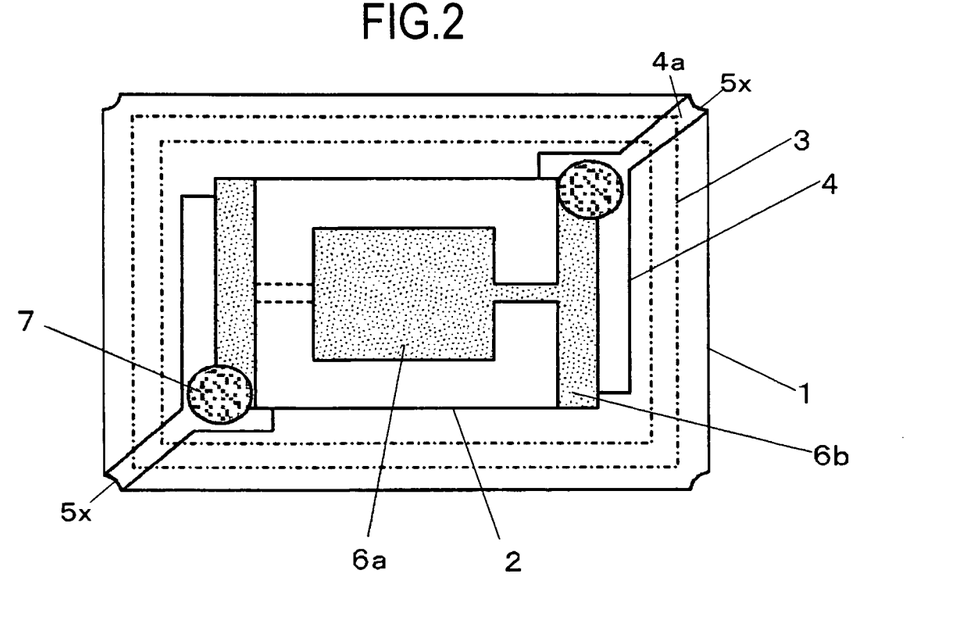
FIG. 2 is an explanatory plan view of the surface mount crystal oscillator according to the embodiment of the present invention.

[Planar Characteristics of Surface Mount Crystal Oscillator: FIG. 2]

Next, planar characteristics of the present oscillator will be described with reference to FIG. 2. FIG. 2 is an explanatory plan view of the surface mount crystal oscillator according to the embodiment of the present invention.

In the present oscillator, as shown in FIG. 2, the crystal holding terminals 4 for holding both ends of the crystal piece 2 are formed so as to face each other on the ceramic base (the substrate) 1, and each leading terminal 4a is formed so as to be led to the shortest corner portion of the substrate 1 from the end portion of the crystal holding terminal 4, and is connected to the through terminal 5x. That is, two leading terminals 4a are connected to the through terminals 5x of the corner portions in reverse directions.

In a case where the leading terminals 4a are led to the corner portions of the substrate 1 and connected to the through terminals 5x in the corner portions, a sufficient distance can be obtained as compared with a case where the leading terminals are led outwardly in a horizontal direction or a vertical direction of the substrate 1, which avoids the short circuit between the crystal holding terminals 4 and the through terminals 5x via the metal cover 3, even if the metal cover 3 is displaced.

Moreover, the crystal piece 2 is connected to the crystal holding terminals 4 via the conductive adhesive 7 in the end portions of the crystal holding terminals 4 from which the leading terminals 4a are led.

As shown in FIG. 2, such a structure as to hold the crystal piece 2 by the crystal holding terminals 4 in both the end portions of the crystal piece 2 is referred to as a 'both-ends holding' type.

A characteristic pattern of the crystal holding terminals 4 will be described later.

[Each Part of Surface Mount Crystal Oscillator]

The ceramic base (the substrate) 1 has a shape of a flat plate comprising a rectangular single plate, the crystal holding terminals 4 are formed at both ends of one main surface (the front surface) of the base, and mount terminals 5a and 5b are formed in four corner portions of the other main surface (the back surface) thereof.

Moreover, the mount terminals 5a and 5b formed in the four corner portions of the back surface thereof are connected to the through terminals 5x formed on the wall faces of the through holes 9.

Here, the mount terminal 5a is connected to the leading terminal 4a via the through terminal 5x, whereas the mount terminal 5b is connected to the through terminal 5x but is not connected to the leading terminal 4a.

The crystal piece 2 is AT cut, and excitation electrodes 6a facing each other are formed on both main surfaces of the crystal piece.

Moreover, the crystal piece 2 is provided with leading electrodes 6b extending from the excitation electrodes 6a to both end portions in mutually opposite directions to be folded back over the whole width in a width direction.

Furthermore, one set of extending diagonal portions (end portions) of the leading electrode 6b are secured to the crystal holding terminal 4 by the conductive adhesive 7, to electrically and mechanically connect the leading electrode 6b to the crystal holding terminals 4.

The metal cover 3 has a recessed shape and has opening end faces thereof bent in an L-shape, and is joined to the substrate 1 along the outer peripheral surface of the substrate 1 by the insulating seal material 8, for example, a resin or glass.

The crystal holding terminals 4 are configured to hold the crystal piece 2, and are made of a silver (Ag)-palladium (Pd) alloy. Moreover, each leading terminal 4a is formed along the shortest corner portion of the substrate 1 from the end portion of the crystal holding terminal 4.

The through terminals 5x are formed on the side walls of the through holes 9 formed in the four corners of the substrate 1, and are made of an AgPd alloy in the same manner as in the crystal holding terminals 4.

Moreover, the leading terminals 4a are connected to the through terminals 5x in the four corner portions of the substrate 1.

Additionally, since the leading terminals 4a are formed along the diagonal line of the substrate 1, the terminals are connected to the through terminals 5x in the diagonal corner portions thereof, but the through terminals 5x are not connected to the leading terminals 4a in other diagonal corner portions.

The mount terminals 5a and 5b are formed in four corners of the back surface of the substrate 1, and connected to the through terminals 5x in the corner portions of the substrate 1.

As described above, the through terminals 5x include the through terminals connected to the leading terminals 4a and the through terminals which are not connected to the leading terminals, and on the back surface of the substrate 1, the mount terminals 5a connected to the through terminals 5x connected to the leading terminals 4a are brought into contact with each other and energized in a test by a measurement device, thereby regulating a vibration frequency as described later.

The conductive adhesive 7 electrically and mechanically connect the leading electrodes 6b of the crystal piece 2 to the crystal holding terminals 4.

The seal material 8 is an insulating and joining resin disposed to secure the cover 3 onto the substrate 1 so that the contact face of the cover 3 does not come in contact with the leading terminals 4a and the like (does not cause any short circuit).

The through holes 9 are formed simultaneously with break lines in a ceramic sheet before divided into the substrates 1, and the holes are formed in the four corner portions of the divided substrate 1 so as to extend through the front surface and back surface thereof.

Figure 3:
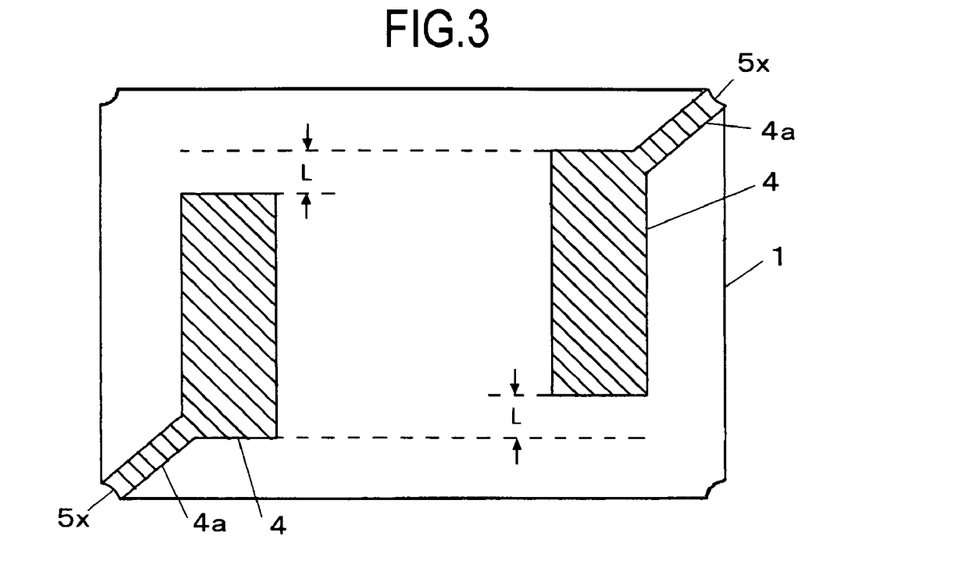
FIG. 3 is a schematic plan view for explaining a pattern of crystal holding terminals.

[Pattern of Crystal Holding Terminal: FIG. 3]

Next, specific patterns of the crystal holding terminals 4 and leading terminals 4a will be described with reference to FIG. 3. FIG. 3 is a schematic plan view for explaining the pattern of the crystal holding terminals.

In the pattern of the crystal holding terminals 4, as shown in FIG. 3, the terminals are formed so as to face each other around the center of the substrate 1, and the end portions of the terminals which are not provided with the leading terminals 4a are shorter than those of conventional crystal holding terminals as much as a length L. In consequence, even when the metal cover 3 comes in contact with one of the crystal holding terminals 4, the cover is prevented from coming in contact with the other crystal holding terminal 4, to avoid the short circuit.

Figure 4:
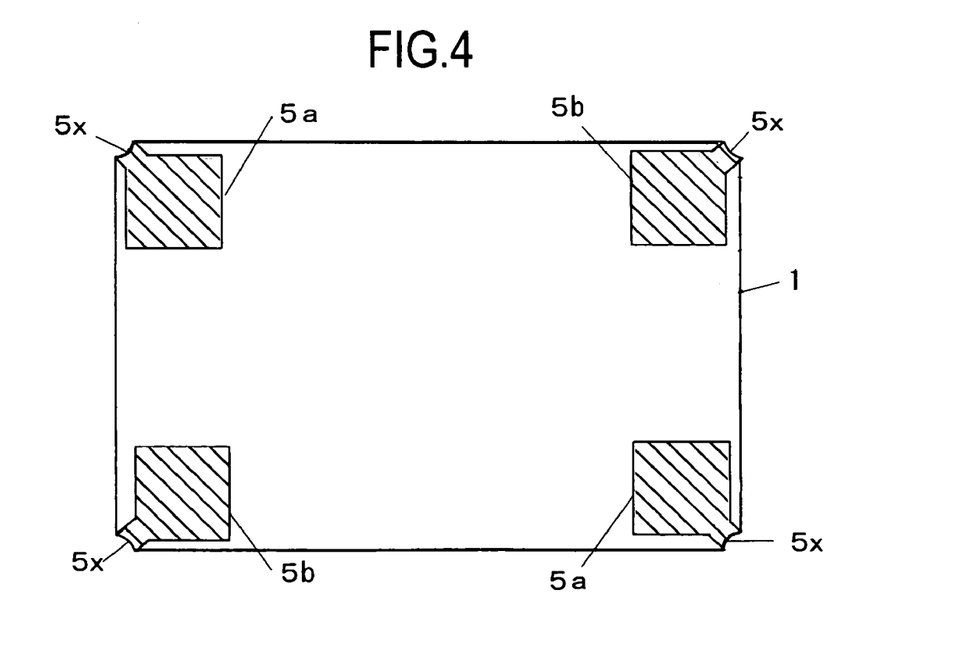
FIG. 4 is a schematic plan view for explaining a pattern of mount terminals.

[Pattern of Mount Terminal 5a on Back Surface of the Present Oscillator: FIG. 4]

Moreover, on the back surface of the substrate 1, the mount terminals 5a and 5b have a pattern shown in FIG. 4, and in the four corners of the substrate 1, rectangular metal terminals are connected to the through terminals 5x formed on the wall faces of the through holes 9.

FIG. 4 is a schematic plan view for explaining the pattern of the mount terminals.

Figure 5:
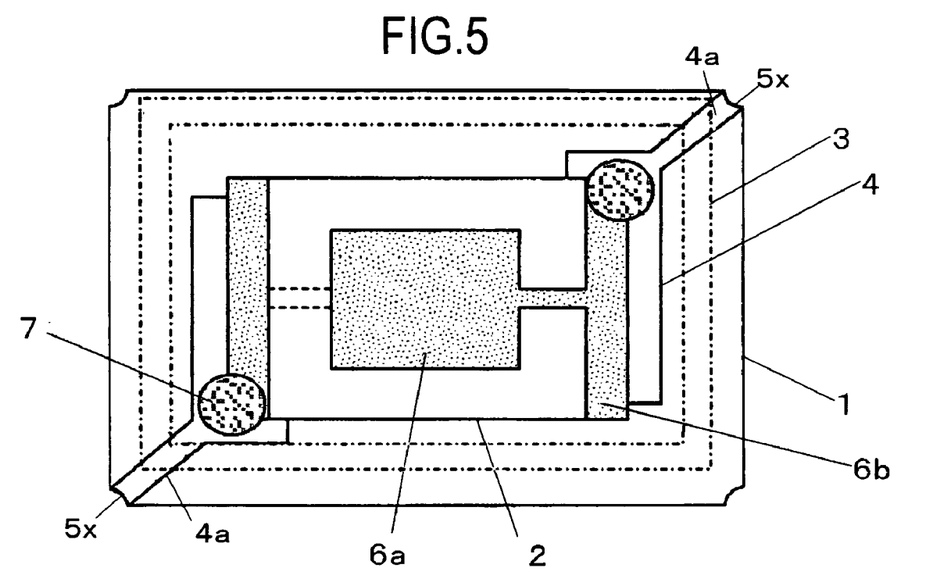
FIG. 5 is an explanatory plan view showing displacement of a metal cover.

[Displacement of Metal Cover: FIG. 5]

Next, displacement of the metal cover 3 in the present oscillator will be described with reference to FIG. 5. FIG. 5 is an explanatory plan view showing the displacement of the metal cover.

A place shown by dotted lines of FIG. 2 indicates a contact face in a case where the metal cover 3 is normally disposed, and a place shown by dotted lines of FIG. 5 indicates the contact face of the metal cover 3 in a case where the displacement occurs.

Even when the displacement of the metal cover 3 occurs, the crystal holding terminal 4 is shorter than the conventional crystal holding terminal as much as the length L, and the end portion of the crystal holding terminal 4 is short inwardly from the end portion of the leading electrode 6b in a longitudinal direction. Therefore, even when the metal cover 3 comes in contact with the other crystal holding terminal 4, the end portion of the crystal holding terminal 4 does not come in contact with the metal cover 3. In consequence, it is possible to avoid the short circuit between the one crystal holding terminal 4 and the other crystal holding terminal 4 via the metal cover 3.

Specifically, in FIG. 5, even when the lower portion of the opening end face of the metal cover 3 comes in contact with the one crystal holding terminal 4 in the horizontal direction, the metal cover 3 does not come in contact with the other crystal holding terminal 4 in the same horizontal direction, so that the short circuit can be avoided.

Figure 6:
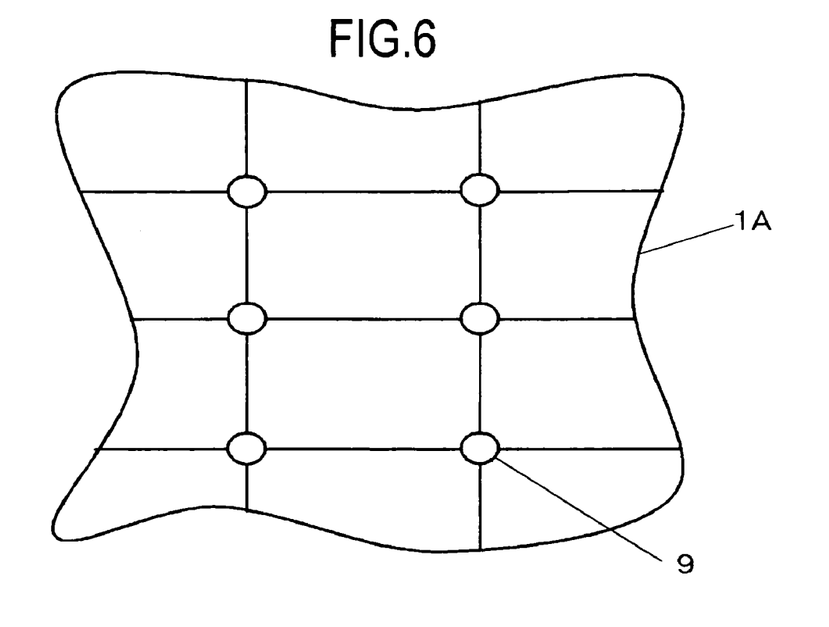
FIG. 6 is a diagram showing that through holes and break lines are formed in a sheet-like ceramic plate.
Figure 7:
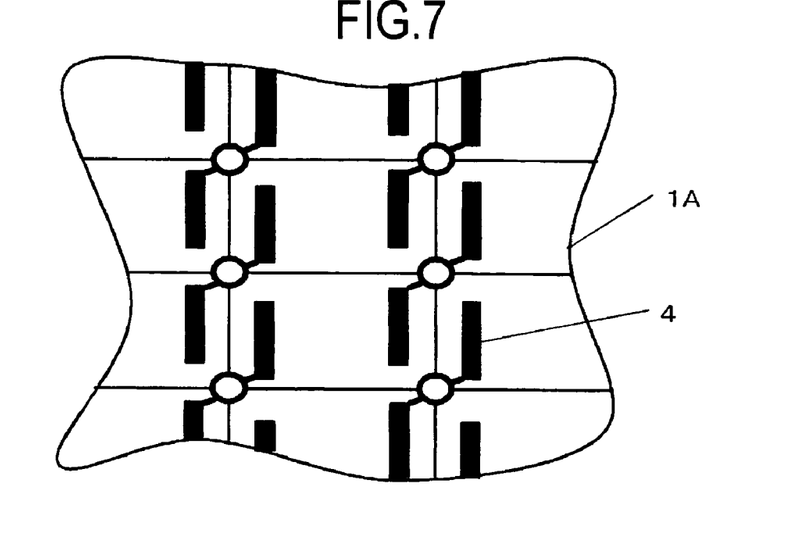
FIG. 7 is a diagram showing that the pattern of the crystal holding terminals is formed on the sheet-like ceramic plate.
Figure 8:
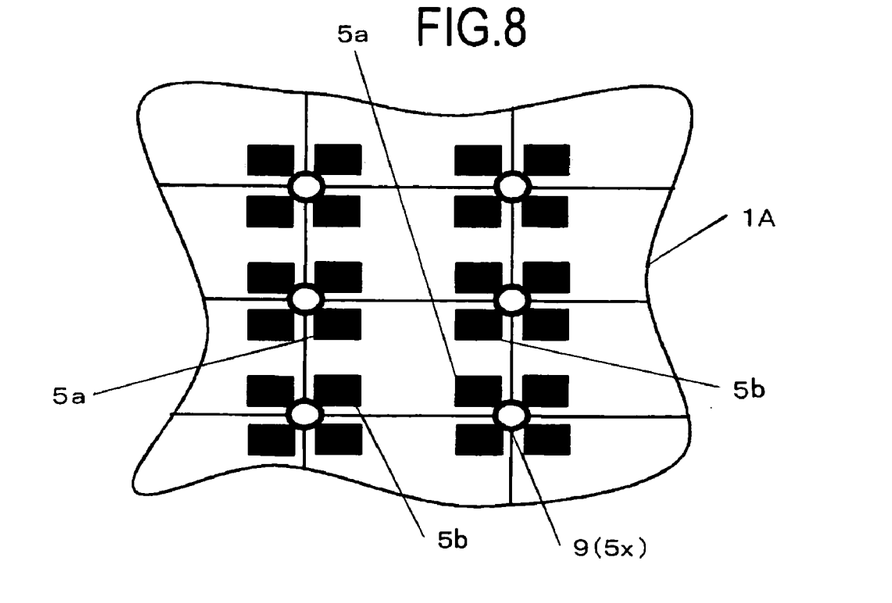
FIG. 8 is a diagram showing that the pattern of the mount terminals is formed on the sheet-like ceramic plate.

[Manufacturing Method of the Present Oscillator: FIGS. 6 to 8]

Next, a manufacturing method of the present oscillator will be described with reference to FIGS. 6 to 8. FIG. 6 is a diagram showing that through holes and break lines are formed in a sheet-like ceramic plate, FIG. 7 is a diagram showing that the pattern of the crystal holding terminals is formed on the sheet-like ceramic plate, and FIG. 8 is a diagram showing that the pattern of the mount terminals is formed on the sheet-like ceramic plate.

[First Step: FIG. 6/Sheet-Like Ceramic Material Firing]

First, a sheet-like ceramic material is formed as the material of a sheet-like ceramic base 1A.

In the sheet-like ceramic material, as shown in FIG. 6, break lines for separating adjoining regions corresponding to the individual ceramic bases 1 from one another are formed, and the through holes 9 are formed in four corner portions of each base.

Subsequently, the sheet-like ceramic material provided with the through holes 9 is fired, thereby obtaining the sheet-like ceramic base 1A.

[Second Step: FIGS. 7 and 8/Circuit Pattern Formation]

Next, the regions corresponding to circuit patterns of the sheet-like ceramic base 1A are provided with a metal paste of the AgPd alloy by printing using masks.

As to each circuit pattern, as shown in FIG. 7, the pattern of the crystal holding terminals 4 is formed on one main surface (the front surface), and as shown in FIG. 8, the pattern of the mount terminals 5a and 5b is formed on the other main surface (the back surface). Furthermore, the through terminals 5x are formed on the wall faces of the through holes 9.

The crystal holding terminals 4 on the one main surface (the front surface) are point-symmetric around the center of each ceramic base 1 as described above. That is, the leading terminals 4a are formed along the diagonal line of the ceramic base 1.

Moreover, one set of diagonally formed mount terminals 5a on the other main surface (the back surface) are external crystal terminals electrically connected to the crystal holding terminals 4 through the through terminals 5x and the leading terminals 4a, and the other set of diagonally formed mount terminals 5b are dummy terminals.

Subsequently, the metal paste of the AgPd alloy is fired to obtain the sheet-like ceramic base 1A provided with the circuit patterns.

It is to be noted that a ceramic firing temperature is from about 1500 to 1600° C. and the firing temperature of the AgPd alloy is a lower temperature of 850° C., whereby after firing the ceramic material, the AgPd alloy paste is applied, and fired together with the ceramic material.

This is because if the AgPd alloy paste is applied to the ceramic material and fired at the ceramic firing temperature, the AgPd alloy paste is agglomerated in the form of grains owing to the excessively high temperature and any circuit pattern cannot be formed.

[Third Step/Crystal Piece Mounting]

Next, the outer peripheral portion of the crystal piece 2 including the leading electrodes 6b extended from the excitation electrodes 6a is secured and mounted onto each crystal holding terminal 4 of the sheet-like ceramic base 1A provided with the circuit patterns by the conductive adhesive 7, to electrically and mechanically connect the crystal piece to the terminals.

Here, one set of diagonal portions of the crystal piece 2 including the extended leading electrodes 6b are secured.

[Fourth Step/Frequency Regulation]

Next, the vibration frequency of each crystal piece 2 as a crystal oscillator mounted (secured) onto the sheet-like ceramic base 1A is regulated in accordance with a mass load effect.

Specifically, on the back surface of the sheet-like ceramic base 1A, a measurement terminal (a probe) from a measurement unit is brought into contact with the mount terminal 5a electrically connected to each crystal piece 2. Subsequently, the excitation electrode 6a on the front surface of the crystal piece 2 on which a plate face is exposed is irradiated with gas ions to cut the front surface from the electrode, and the mass of the excitation electrode 6a is decreased to regulate the vibration frequency from a low frequency to a high frequency.

Alternatively, for example, a metal film is applied onto the excitation electrode 6a by evaporation or sputtering, whereby the vibration frequency may be regulated from a high frequency to a low frequency.

[Fifth Step/Metal Cover Joining (Sealing)]

Next, the opening end face of the metal cover 3 having the recessed shape is joined, via the seal material 8, to the front surface of the outer periphery of the rectangular region corresponding to each ceramic base 1 of the sheet-like ceramic base 1A on which the crystal piece 2 is mounted.

Here, a resin beforehand applied to the opening end face of the metal cover 3 is used as the seal material 8, heated, molten and joined. For example, the opening end face of the metal cover 3 is formed in an L-shape to lengthen a so-called seal path. In consequence, a sheet-like crystal oscillator is formed in which the individual crystal pieces 2 are sealed and collected.

[Sixth Step/Dividing]

Finally, the sheet-like ceramic base 1A including the crystal oscillators collected therein is longitudinally and transversely divided along the break lines to obtain individual surface mount crystal oscillators.

In the manufacturing method of the present embodiment, the circuit pattern (the crystal holding terminals 4, the through terminals 5x and the mount terminals 5a) of the ceramic base 1 is made of the AgPd alloy. After firing the sheet-like ceramic material provided with the through holes 9, the AgPd alloy paste is applied and fired to form the circuit pattern.

Therefore, as compared with a conventional example in which a tungsten (W) paste is applied to the sheet-like ceramic material and fired to form nickel (Ni) and gold (Au) by electrolytic plating, two electrolytic plating steps are not necessary, whereby the number of manufacturing steps can be decreased.

Moreover, since the electrolytic plating steps are not necessary, for example, electrolytic plating wiring lines for electrically connecting the circuit patterns of the ceramic bases 1 to each other are also not necessary, which produces an effect that the circuit patterns can be simplified and made inexpensive.

Moreover, here, in the state of the sheet-like ceramic base 1A provided with the circuit patterns, the crystal pieces 2 are mounted (the third step), the frequency is regulated (the fourth step) and the metal covers 3 are joined (the fifth step).

Therefore, in the state of the sheet-like ceramic base 1A, these steps can continuously be performed, which produces an effect that productivity can be improved.

Furthermore, in the present embodiment, the mount terminals 5a and 5b on the back surface of the ceramic base 1 are four electrically independent terminals. On the other hand, in the state of the sheet-like ceramic base 1A, the mount terminals 5a and 5b (four terminals) in four corner portions of adjoining rectangular regions are electrically connected in common through the through terminals 5*x*.

Therefore, also in a state where the mount terminals 5*a* and 5*b* in the four corner portions are connected in common, an effect is produced that the measurement terminal can be brought into contact with one set of mount terminals 5*a* of the diagonal portions connected to the crystal holding terminals 4 of each ceramic base 1 to regulate the vibration frequency of each crystal piece 2.

Figure 9:
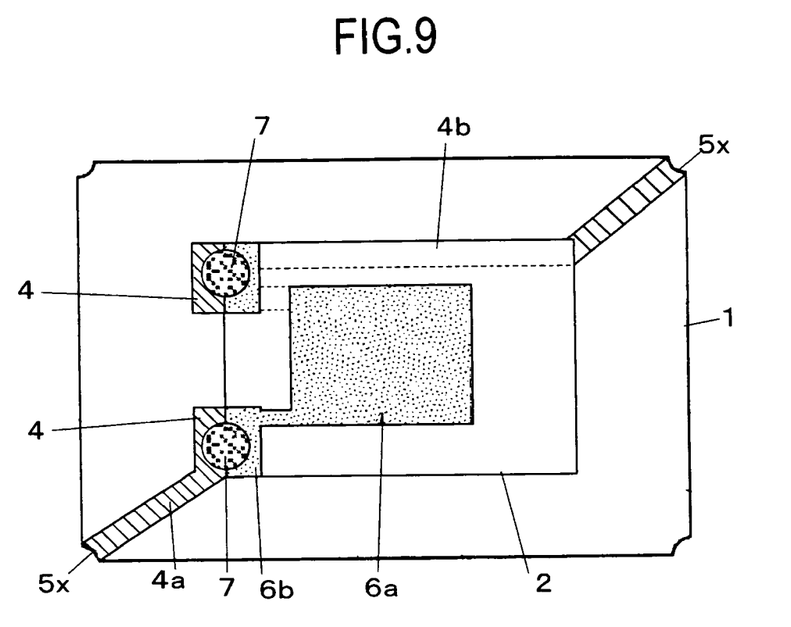
FIG. 9 is an explanatory plan view of a surface mount crystal oscillator according to another embodiment.

[Cantilever Type: FIG. 9]

Next, a surface mount crystal oscillator according to another embodiment will be described with reference to FIG. 9. FIG. 9 is an explanatory plan view of the surface mount crystal oscillator according to the other embodiment.

In the surface mount crystal oscillator according to the other embodiment (the other oscillator), as shown in FIG. 9, a leading electrode 6*b* is formed in one end portion of a crystal piece 2, and the one end portion is connected to a crystal holding terminal 4 via a conductive adhesive 7. In the one crystal holding terminal 4, a leading terminal 4*a* is formed in the shortest corner portion, and in another crystal holding terminal 4, a leading terminal 4*b* is led under the crystal piece 2 in a horizontal direction of FIG. 9, and formed to be connected to the shortest corner portion from the corner portion of the crystal piece 2.

A constitution of FIG. 9 is referred to as a 'cantilever' type, because one side of the crystal piece 2 is held.

Also in the cantilever type of FIG. 9, the crystal piece is connected to mount terminals 5*a* on the back surface via through terminals 5*x* formed in through holes 9 along a diagonal line in the same manner as in the both-ends holding type of the present oscillator, and the back surface has a pattern of mount terminals 5*a* and 5*b* shown in FIG. 8.

It is to be noted that a manufacturing method of the other oscillator in FIG. 9 is similar to the manufacturing method of the present oscillator, which produces an effect that productivity can be improved.

Moreover, a measurement terminal is brought into contact with the mount terminal 5*a* on the back surface, whereby frequency regulation of each crystal piece 2 can similarly be performed.

Effect of the Embodiment

According to the present oscillator and the other oscillator, the ceramic base 1 is a single plate, and hence a manufacturing unit price can basically be lowered. The electrodes including the crystal holding terminals 4 are made of the AgPd alloy. Therefore, as compared with a conventional case where W, Ni and Au are used, an effect is produced that a material cost of the electrodes or the number of steps can be decreased to further make the oscillator inexpensive.

Furthermore, according to the present oscillator and the other oscillator, the leading terminals 4*a* from the crystal holding terminals 4 are led to the corner portions of the ceramic base 1 along the diagonal line thereof, and connected to the mount terminals 5*a* on the back surface via the through terminals 5*x* formed on the wall faces of the through holes 9 formed in the corner portions. Therefore, as compared with a case where the leading terminals 4*a* are led in the horizontal direction or the vertical direction, the leading terminals can be lengthened. Even if the opening end face portion of the metal cover 3 comes in contact with one end of the one crystal holding terminal 4, the cover portion is distant from the through terminal 5*x*, which produces an effect that the cover can be prevented from being brought into contact with the through terminal 5*x* to avoid electric short (the short circuit).

Moreover, in the present oscillator, the end portion of the crystal holding terminal 4 is shorter than the leading electrode 6*b* of the crystal piece. Therefore, if the opening end face portion as one side of the metal cover 3 comes in contact with the one crystal holding terminal 4, the cover can be prevented from coming in contact with the other crystal holding terminal 4 in the same direction.

In consequence, an effect is produced that a pair of crystal holding terminals 4 can be prevented from electrically causing the short circuit via the metal cover 3, and productivity can be improved.

Furthermore, in the other oscillator, the leading terminal 4*b* is passed under the crystal piece 2 and connected to the leading electrode 6*b*, which produces an effect that a pair of crystal holding terminals 4 can be prevented from causing the short circuit via the metal cover 3 with respect to the vertical direction of FIG. 9.

However, the crystal holding terminals 4 are arranged side by side in the vertical direction of FIG. 9, and hence attention needs to be paid to displacement in a transverse direction of FIG. 9.

Moreover, according to the present oscillator and the other oscillator, resistance to the displacement of the metal cover 3 is imparted, which produces an effect that the variance of the secured state of the conductive adhesive 7 is suppressed and stabilized, and aging characteristics of the surface mount crystal oscillator can satisfactorily be kept.

The present invention is suitable for a surface mount crystal oscillator which can enhance a product quality and improve productivity while realizing miniaturization and a manufacturing method of the oscillator.

What is claimed is:

1. A surface mount crystal oscillator comprising a crystal piece held by first and second crystal holding terminals on a rectangular ceramic substrate,
    wherein one leading electrode and the other leading electrode of the crystal piece are led in opposite directions,
    the first crystal holding terminal and the second crystal holding terminal constitute such a both-ends holding type as to hold both ends of the crystal piece,
    on wall faces of through holes formed in corner portions of the substrate, through terminals are formed,
    on the front surface of the substrate, a first leading terminal led from the first crystal holding terminal is connected to the through terminal of the shortest corner portion, and a second leading terminal led from the second crystal holding terminal is connected to the through terminal of the corner portion in a direction reverse to a direction in which the first leading terminal is led, and on the back surface of the substrate, mount terminals connected to the through terminals are formed,
    the first crystal holding terminal is connected to the one leading electrode of the crystal piece by a conductive adhesive in an end portion from which the first leading terminal is led, and
    the second crystal holding terminal is connected to the other leading electrode of the crystal piece by the conductive adhesive in an end portion from which the second leading terminal is led.

2. The surface mount crystal oscillator according to claim 1, wherein the end portion of the first crystal holding terminal on a side on which any conductive adhesive is not disposed is formed to be short inwardly from the end portion of the one leading electrode, and the end portion of the second crystal holding terminal on a side on which any conductive adhesive is not disposed is formed to be short inwardly from the end portion of the other leading electrode.

3. A surface mount crystal oscillator comprising a crystal piece held by first and second crystal holding terminals on a rectangular ceramic substrate, wherein one leading electrode and the other leading electrode of the crystal piece are led in the same direction, the first crystal holding terminal and the second crystal holding terminal constitute such a cantilever type as to hold one end of the crystal piece, on wall faces of through holes formed in corner portions of the substrate, through terminals are formed, on the front surface of the substrate, a first leading terminal led from the first crystal holding terminal is connected to the through terminal of the shortest corner portion, and a second leading terminal led from the second crystal holding terminal is connected to the through terminal of the corner portion in a direction reverse to a direction in which the first leading terminal is led, and on the back surface of the substrate, mount terminals connected to the through terminals are formed, the first crystal holding terminal is connected to the one leading electrode led to one side of the crystal piece by a conductive adhesive in an end portion from which the first leading terminal is led, and the second crystal holding terminal is connected to the other leading electrode led to the one side of the crystal piece by a conductive adhesive in the one side of the crystal piece from which the other leading electrode is led, and the second leading terminal passes under the crystal piece from a position of the second crystal holding terminal connected by the conductive adhesive and is connected to the through terminal of the corner portion in the direction reverse to the direction in which the first leading terminal is led.

4. A manufacturing method of a surface mount crystal oscillator comprising a crystal piece held by first and second crystal holding terminals on a rectangular ceramic substrate, comprising:

a step of forming, in a sheet-like ceramic material, break lines which specify individual ceramic substrate regions and through holes which correspond to corner portions of the regions and firing the ceramic material to form a sheet-like ceramic base;

a step of forming metal layers of through terminals on wall faces of the through holes, forming, on the front surface of the ceramic base, a pattern of a metal layer in which the first crystal holding terminal and a first leading terminal led from the terminal are connected to the through terminal of the shortest corner portion, and a second leading terminal led from the second crystal holding terminal is connected to the through terminal of the corner portion in a direction reverse to a direction in which the first leading terminal is led, and forming, on the back surface of the ceramic base, a pattern of a metal layer of mount terminals connected to the through terminals;

a step of mounting the crystal piece on the first and second crystal holding terminals; and a step of regulating a vibration frequency by use of the mount terminal connected to the first crystal holding terminal and the mount terminal connected to the second crystal holding terminal.

5. The manufacturing method of the surface mount crystal oscillator according to claim 4, wherein an excitation electrode on the front surface of the crystal piece is irradiated with gas ions to cut the front surface from the excitation electrode, and a mass of the excitation electrode is decreased to regulate the vibration frequency from a low frequency to a high frequency.

6. The manufacturing method of the surface mount crystal oscillator according to claim 4, wherein a metal film is applied onto the excitation electrode to regulate the vibration frequency from a high frequency to a low frequency.

* * * * *